United States Patent
Choi et al.

[19]

[11] Patent Number: 6,084,451
[45] Date of Patent: Jul. 4, 2000

[54] PULSE WIDTH MODULATION CONTROLLER OPERATIONAL IN BOTH CURRENT AND VOLTAGE MODE

[75] Inventors: Nak-choon Choi; Kyung-hee Jang; Sang-woo Lee, all of Bucheon, Rep. of Korea

[73] Assignee: Samsung Electronics, Co., Ltd., Suwon, Rep. of Korea

[21] Appl. No.: 09/094,391

[22] Filed: Jun. 9, 1998

[30] Foreign Application Priority Data

Jun. 9, 1997 [KR] Rep. of Korea ............. 97-23665

[51] Int. Cl.[7] .............. H03K 3/017; H03K 5/04; H03K 7/08
[52] U.S. Cl. ............................. 327/172; 327/175
[58] Field of Search ................... 327/538, 540, 327/541, 543, 172, 175, 134, 108, 109, 427; 332/109, 10

[56] References Cited

U.S. PATENT DOCUMENTS

| | | | |
|---|---|---|---|
| 5,045,991 | 9/1991 | Dhyanchand et al. | 363/89 |
| 5,452,198 | 9/1995 | Jessee | 363/78 |
| 5,894,243 | 4/1999 | Hwang | 327/540 |

*Primary Examiner*—Toan Tran
*Assistant Examiner*—Quan Tra

*Attorney, Agent, or Firm*—Marger Johnson & McCollom, P.C.

[57] ABSTRACT

A pulse width modulation controller is shown which includes an error amplifier, a multiplying portion, an oscillator, a comparator, a flop-flop and a logic gate. The error amplifier receives an externally input feedback voltage and a first reference voltage in order to compare each voltage, and, in a current mode, the multiplying portion outputs a voltage which is proportional to the multiplication product of a voltage generated from a power switching unit and the difference between a second reference voltage and a voltage output from the error amplifier, and, in a voltage mode, outputs a voltage which is proportional to the multiplication product of a ground voltage and the difference between the second reference voltage and the voltage output from the error amplifier. The oscillator generates a clock signal and an inverse sawtooth signal. The comparator compares the inverse sawtooth signal with the output voltage of the multiplying portion. The flip-flop outputs a logic low signal when the clock signal and the output voltage of the comparator are a logic high and a logic low, respectively, and outputs a logic low signal when the clock signal and the output voltage of the comparator are a logic low and a logic high, respectively. Also, the logic gate controls the power switching unit by outputting a logic low signal when either the clock signal or the output of the flip-flop is a logic high, and by outputting a logic high signal when the clock signal and the output of the flip-flop are both logic low.

15 Claims, 6 Drawing Sheets

PULSE WIDTH MODULATION CONTROLLER OPERATIONAL IN BOTH CURRENT AND VOLTAGE MODE

BACKGROUND OF THE INVENTION

1. Field of the Invention

The present invention relates to a pulse width modulation controller and, more particularly, to a pulse width modulation controller for controlling a power switching means.

2. Description of the Related Art

Since the early development of the field effect transistor (FET), the FET has been typically used in low power applications where each transistor conducted relatively low levels of current, such as in Integrated Circuits (IC). The FET is now also used in high power applications, i.e. 100/200 v commercial voltage levels, where a FET switch is used to conduct high current levels. One of the circuits commonly used for controlling the on/off operation of a FET is a pulse width modulation controller.

FIG. 1 is a block diagram of a conventional pulse width modulation controller operating in a current mode. Referring to FIG. 1, there is an N-channel FET 13 operating as a switching means, two capacitors Cc and Ct, and resistors Rs and Rt. The conventional pulse width modulation controller 11 is an IC having external connections to the N-channel FET 13, the capacitors Cc and Ct and the resistors Rs and Rt. The pulse width modulation controller 11 for current mode includes an error amplifier 21, a comparator 23, an oscillator 25, an RS flip-flop 27, a NOR gate 29, and external contact pins 31–38.

When a feedback voltage Vfb is applied to the pulse width modulation controller 11, the error amplifier 21 compares the feedback voltage Vfb with a reference voltage Vref. The voltage output from the error amplifier 21 is divided by N using divider 41 and then applied to an inverting input terminal of the comparator 23. The comparator 23 then compares a voltage Vcs of the resistor Rs with the voltage output from the divider 41. Output $\overline{Q}$ of the RS flip-flop 27 is controlled by the voltage output from the comparator 23. The output of the NOR gate 29 is controlled by the output $\overline{Q}$ of the RS flip-flop and the output of the oscillator 25. The on/off operation of the N-channel FET transistor 13 is therefore controlled according to the voltage output from the NOR gate 29.

FIG. 2 is a block diagram of a conventional pulse width modulation controller 11 configured to operate in a voltage mode. In order to convert the conventional pulse width modulation controller from current mode operation to voltage mode operation, the pin 33 connected to the source of N-channel FET 13 in FIG. 1 must be connected instead to the capacitor Ct, as shown in FIG. 2. Thus, in order to be able to convert the conventional pulse width modulation controller 11 from current mode to voltage mode, the capacitor Ct must be external to the pulse width modulation controller circuit 11. If the resistor Rt and the capacitor Ct are integrated into the pulse width modulation controller circuit 11 in order to reduce the number of interface pins for the IC of the pulse width modulation controller 11, then the operational mode of the pulse width modulation controller 11 cannot be converted from current mode to voltage mode.

In addition, the pulse width modulation controller 11 operating in the current mode has a Zener diode 43 at an inverting input terminal of the comparator 23 which limits the current flowing through the N-channel FET 13. The Zener diode 43 maintains the voltage applied to the inverting input terminal of comparator 23 at a constant level. However, the voltage accumulated at capacitor Ct is much higher than the voltage limited by the Zener diode 43. Thus, the maximum duty cycle of the N-channel FET 13 is limited.

Conversely, in order to change the operation mode of the pulse width modulation controller 11 from voltage mode to current mode, the resistor Rs must be connected to the source of the N-channel FET 13. Also, the non-inverting input terminal of the comparator 23 must be disconnected from the capacitor Ct and connected with the source of the N-channel FET transistor 13. However, if the resistor Rs is integrated with the N-channel FET 13, then it is difficult to convert the operation mode of the pulse width modulation controller 11 from voltage mode to current mode.

SUMMARY OF THE INVENTION

To solve the above problems, it is an object of the present invention to provide a pulse width modulation controller which is easily convertible from a current mode to a voltage mode and vice versa.

It is another object of the present invention to provide a pulse width modulation controller including power switching means therein to reduce the number of interface pins.

A first embodiment of a pulse width modulation controller for controlling a power switch, according to the present invention, includes an error amplifier that receives an externally input feedback voltage and a first reference voltage in order to generate an error voltage. The controller also includes a multiplying portion that receives an externally applied voltage and the error voltage and outputs a first control voltage. The externally applied voltage is a voltage generated by the power switch when the controller is configured to operate in a current mode, such that the first control voltage is proportional to the multiplication product of the voltage generated from the power switch times a second reference voltage less the error voltage. The externally applied voltage is a ground voltage when the controller is configured to operate in a voltage mode, such that the first control voltage is proportional to the multiplication product of the ground voltage and the second reference voltage less the error voltage. An oscillator generates a clock signal and an inverse sawtooth signal. A first comparator compares the inverse sawtooth signal with the first control voltage in order to generate a second control voltage. A flip-flop has set, reset and inverting output terminals, where the set terminal receives the clock signal and the reset terminal receives the second control voltage. A logic gate has first and second input terminals and an output terminal, where the first input terminal receives the clock signal, the second terminal is coupled to the inverting output terminal of the flip-flop, and the output terminal is coupled to the power switch such that the output terminal of the logic gate controls the power switch.

Another embodiment of a pulse width modulation controller, according to the present invention, includes first, second, third, fourth and fifth interface pins and a voltage divider having input and output terminals, where the voltage divider is configured to divide a voltage received at the input terminal and output a divided voltage at the output terminal, and where the input terminal of the divider is coupled to the first interface pin. The controller has a power switch having gate, source and drain terminals, where the drain terminal is coupled to the second pin and the source terminal is coupled to the third pin. A resistor is coupled between the source of the power switch and the fourth pin. There is a multiplying portion having first and second input terminals and an output terminal, where the first input terminal of the multiplying portion is coupled to the output terminal of the voltage divider, and where the multiplying portion is configured to multiply a voltage received at the second input terminal by a difference voltage between a first reference voltage and the divided voltage received at the first input terminal. A voltage reference is coupled between the source of the power switch and the second input terminal of the multiplying portion. An oscillator is configured to generate a clock signal at a first output terminal of the oscillator and an inverse sawtooth signal at a second output terminal of the oscillator. The controller also includes a first comparator having inverting and non-inverting input terminals and an output terminal, where the non-inverting input terminal of the first comparator is coupled to the output terminal of the multiplying portion and the inverting terminal of the first comparator is coupled to the second output terminal of the oscillator. A flip-flop having set and reset terminals and an inverting output terminal is included where the set terminal is coupled to the first output terminal of the oscillator and the reset terminal is coupled to the output terminal of the first comparator. And the controller includes a logic gate having first and second input terminals and an output terminal, where the first input terminal of the logic gate is coupled to the inverting output terminal of the flip-flop, the second input terminal of the logic gate is coupled to the first output terminal of the oscillator, and the output terminal of the logic gate is coupled to the gate of the power switch.

BRIEF DESCRIPTION OF THE DRAWINGS

The above objects and advantages of the present invention will become more apparent by describing in detail the preferred embodiments thereof with reference to the attached drawings in which.

DESCRIPTION OF THE PREFERRED EMBODIMENTS

Figure 1:
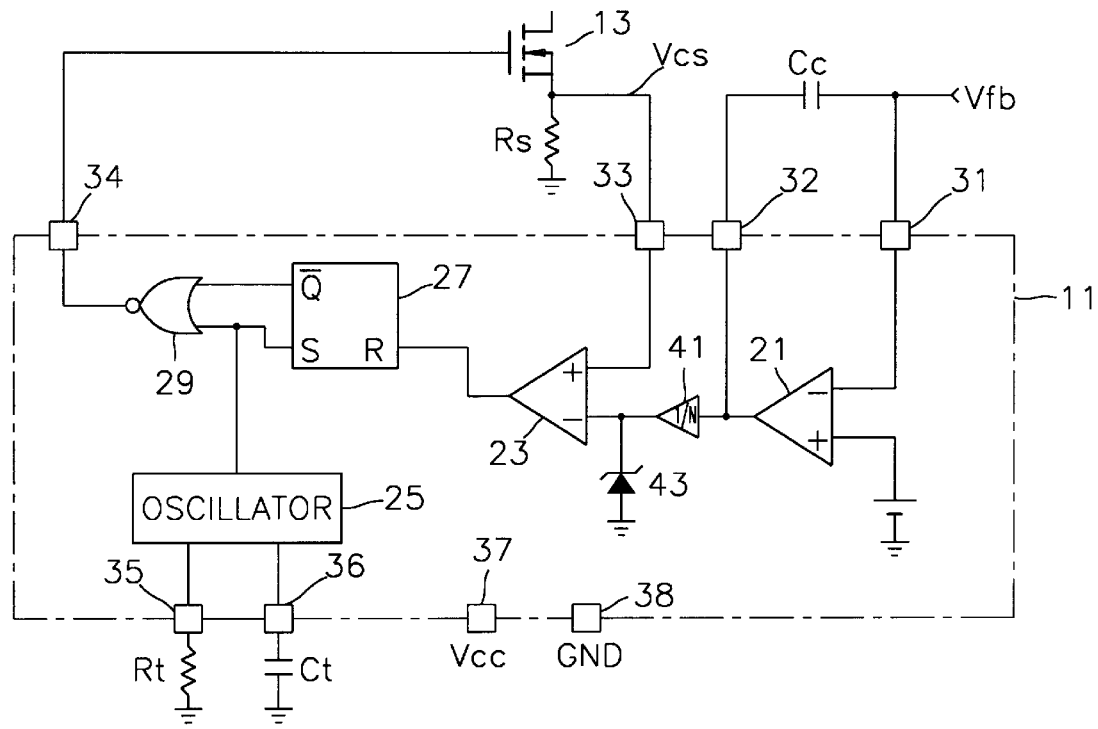
FIG. 1 is a block diagram of a conventional pulse width modulation controller configured to operate in a current mode.
Figure 2:
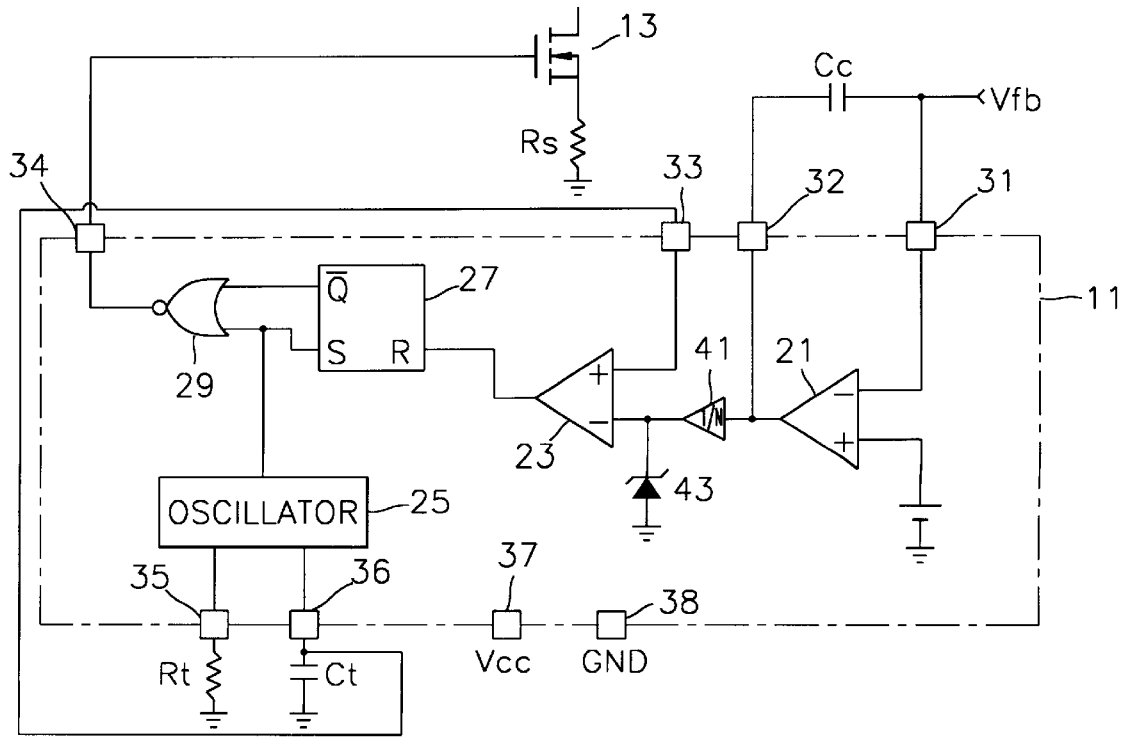
FIG. 2 is a block diagram of the conventional pulse width modulation controller configured to operate in a voltage mode.
Figure 3:
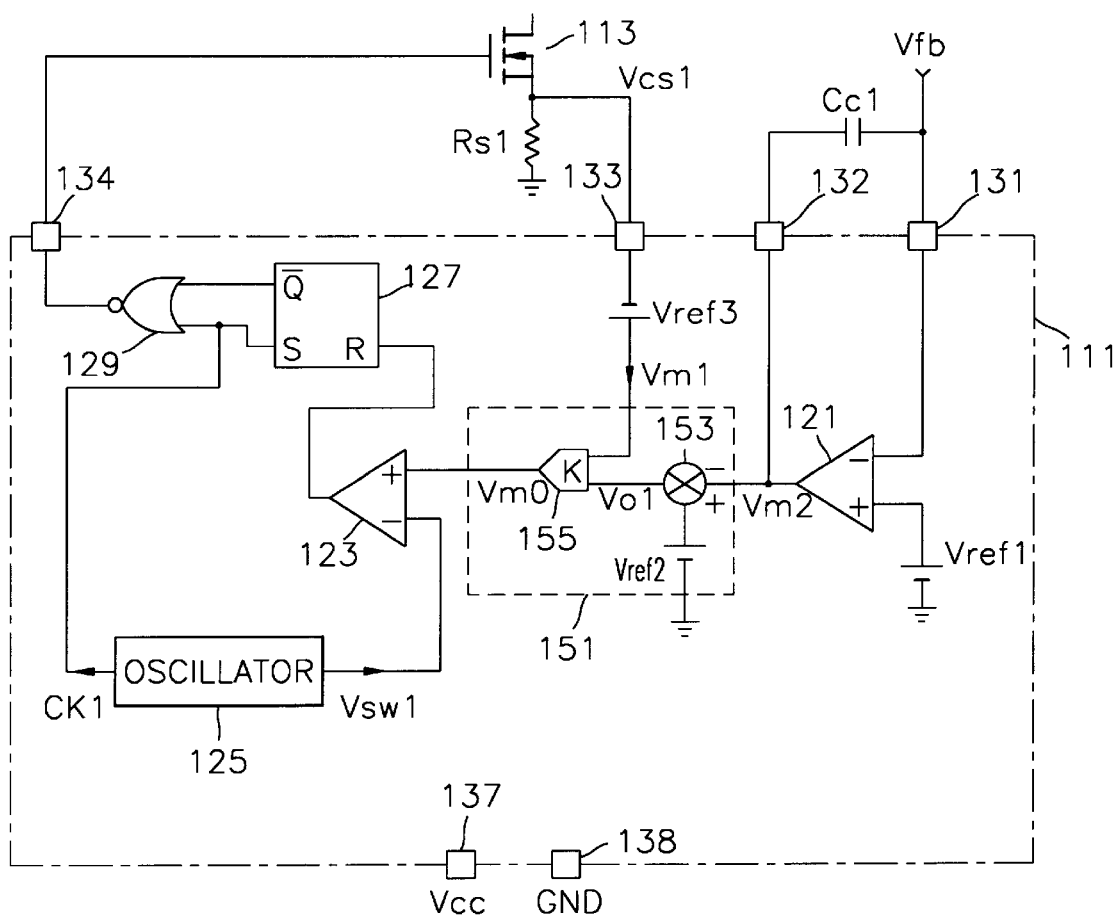
FIG. 3 is a diagram illustrating control of a power switching means in a current mode using a pulse width modulation controller according to a first embodiment of the present invention.

Referring to FIG. 3, there is a power switching means 113, i.e. N-channel field effect transistor (FET) 113, and a source resistor Rs1 connected between a source of the N-channel FET 113 and a ground terminal GND. Also, a first embodiment of a pulse width modulation controller 111 according to the present invention is connected to the source of the N-channel FET 113. The source resistor Rs1 provides a source voltage Vcs1 to the pulse width modulation controller 111.

The pulse width modulation controller 111 according to the first embodiment of the present invention includes an error amplifier 121, a multiplying portion 151, a comparator 123, an oscillator 125, a ffip-flop 127 and a NOR gate 129.

An external feedback voltage Vfb is applied to an inverting terminal (−) of the error amplifier 121 through interface pin 131. A first reference voltage Vref1 is applied to a non-inverting terminal (+) of the error amplifier 121. Also, a capacitor Cc1 is connected between the output terminal of the error amplifier 121 and interface pin 131 through interface pin 132. The capacitor Cc1 removes ripples present in the output voltage Vm2 of the error amplifier 121. The error amplifier 121 compares the feedback voltage Vfb with the first reference voltage Vref1 and outputs the compared result as the output voltage Vm2 thereof. If the feedback voltage Vfb is higher than the first reference voltage Vref1, then the output voltage Vm2 of the error amplifier 121 becomes a negative voltage. If the feedback voltage Vfb is lower than the first reference voltage Vref1, then the output voltage Vm2 of the error amplifier 121 becomes a positive voltage.

The multiplying portion 151 includes a subtractor 153 and a multiplier 155. One of input terminals of the subtractor 153 receives the output voltage Vm2 of the error amplifier 121 and the other input terminal thereof receives a second reference voltage Vref2. Thus, the subtractor 153 subtracts the output voltage Vm2 from the second reference voltage Vref2. An output voltage Vo1 output from the subtractor 153 is described by the following formula (1).

$$Vo1 = Vref2 - Vm2 \tag{1}$$

One of input terminals of the multiplier 155 receives the output voltage Vo1 of the subtractor 153, and the other input terminal receives a control voltage Vm1 which is the sum of the source voltage VcS generated from the N-channel FET 113 and a third reference voltage Vref3. The control voltage Vm1 is described by the following formula (2).

$$Vm1 = VcS + Vref3 \tag{2}$$

Thus, the output voltage Vm0 of the multiplying portion 151 is described by the following formula (3).

$$Vm0 = K \times Vm1 \times (Vref2 - Vm2) \tag{3}$$

where K is a gain of the multiplier 155.

The oscillator 125 generates a clock signal CK1 and an inverse sawtooth signal Vsw1. The clock signal CK1 is applied to an input terminal of the NOR logic gate 129 and the inverse sawtooth signal Vsw1 is applied to the inverting terminal (−) of the comparator 123.

The comparator 123 has two input terminals, an inverting terminal (−) and a non-inverting terminal (+). The non-inverting terminal (+) of the comparator 123 receives the output voltage Vm0 of the multiplying portion 151 and the inverting terminal (−) thereof receives the inverse sawtooth signal Vsw1 in order to compare the output voltage Vm0 and the inverse sawtooth signal Vsw1. The result of this comparison is then applied to a reset terminal R of the flip-flop 127. If the output voltage Vm0 is higher than the inverse sawtooth signal Vsw1, then the output voltage of the comparator 123 goes to a positive voltage. If the output voltage Vm0 is lower than the inverse sawtooth signal voltage Vsw1, then the output voltage of the comparator 123 goes to a negative voltage.

An RS flip-flop is used as the flop-flop 127, the truth values of the RS flip-flop are shown in Table 1.

Table 1

TABLE 1

| input | | output |
|---|---|---|
| R | S | $\overline{Q}$ |
| L | L | $\overline{Q}$ |
| L | H | L |
| H | L | H |
| H | H | not defined |

As seen in Table 1, a value output from the output terminal $\overline{Q}$ of the RS flip-flop 127 goes to a logic high (H) when the signal applied to the reset terminal R of the RS flip-flop 127 is a logic high. Conversely, if the signal applied to the reset terminal R is a logic low (L), then a logic low signal is output from the output terminal $\overline{Q}$. That is, if the output voltage of the comparator 123 is positive, then the output of the RS flip-flop 127 goes to a logic high. If the output voltage of the comparator 123 is negative, then the $\overline{Q}$ output of the RS flip-flop goes to a logic low.

The two input terminals of the NOR logic gate 129 receive the output signal from the output terminal $\overline{Q}$ of the RS flip-flop 127 and the clock signal CK1 of the oscillator 125, respectively. Thus, if either the output from the output terminal $\overline{Q}$ of the RS flip-flop 127 or the clock signal CK1 is a logic high, then the output of the logic gate 129 goes to a logic low. If the output from the output terminal $\overline{Q}$ of the RS flip-flop 127 and the clock signal CK1 are both low, then the output of the logic gate 129 goes to a logic high.

Figure 4A:
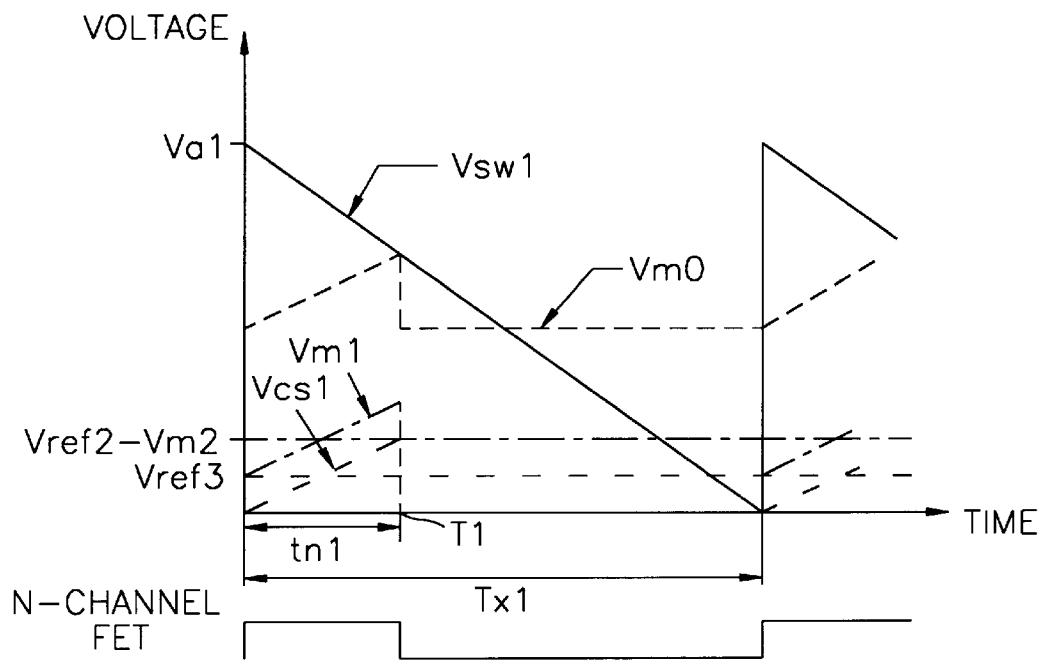
FIG. 4A is a waveform diagram of the signals shown in FIG. 3.

Referring now to FIG. 4A, the operation of the circuit of FIG. 3 will be described. At a point in time T1 where the level of the inverse sawtooth signal voltage Vsw1, which has ramped down from the maximum voltage Va1 toward 0 V, is equal to the output voltage Vm0 of the multiplying portion 151, then the output of comparator 123 transitions to a logic high. The output of comparator 123 going high resets flip-flop 227 causing $\overline{Q}$ to go to a logic high which forces the output of NOR gate 129 to a low and the N-channel FET 113, which has been in an active turned-on state, is turned off.

The output voltage Vm0 of the multiplying portion 151 is higher than the control voltage Vm1 and the source voltage VcS generated from the N-channel FET 113 and is proportional to these voltages. The third reference voltage Vref3 and the output voltage Vo1 of the subtractor 153 are constant DC values. However, the output voltage Vo1 of the subtractor 153 is higher than the third reference voltage Vref3. Also, the minimum level of the control voltage Vm1 is equal to the third reference voltage Vref3.

Figure 4B:
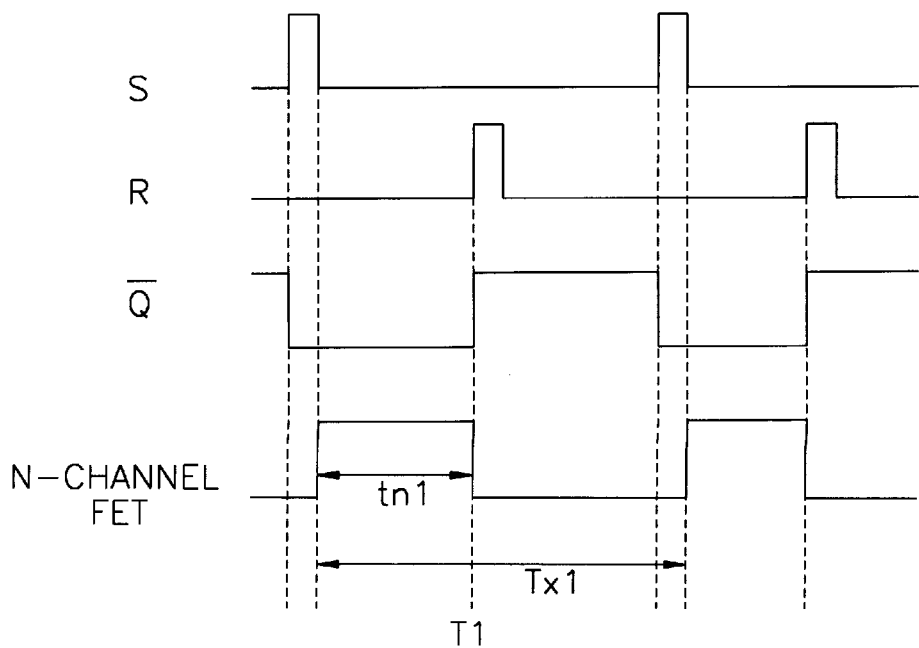
FIG. 4B is a timing diagram showing the switching relationship between the input/output signals of the RS flip-flop of FIG. 3 and the N-channel field effect transistor (FET)

Referring now to FIG. 4B, the clock signal output from oscillator 125 inputs a logic high at the set terminal S of the RS flip-flop 127 to go to a logic high while the reset terminal R of the RS flip-flop is in a logic low state and causes the output terminal $\overline{Q}$ of the RS flip-flop 127 to go a logic low. When the set terminal S of the RS flip-flop 127 is toggled from a logic high to a logic low, the flip-flop retains its state and the N-channel FET 113 remains turned on. Then, when the reset terminal R of the RS flop-flop 127 goes to a logic high, the output terminal of the RS flip-flop 127 transitions from a logic low to a logic high which turns off the N-channel FET 113.

Referring to FIGS. 4A and 4B, the operation of the pulse width modulation controller 111 of FIG. 3 will be described in further detail. At a point in time when the clock signal CK1 of the oscillator 125, which is initially at a logic high, transitions to a logic low, then the output of NOR gate 129 goes high and N-channel FET 113 is turned on. When the feedback voltage Vfb is applied to the inverting terminal (−) of the error amplifier 121 while the N-channel FET 113 is turned on, then a voltage Vm2 is output from the error amplifier 121.

The voltage Vm2 is applied to the subtractor 153 so that the subtractor 153 outputs the voltage Vo1 expressed by the formula (1). The voltage Vo1 is applied to the input terminals of the multiplier 155 together with the control voltage Vm1, thus generating the output voltage Vm0 of the multiplying portion 151. The output voltage Vm0 is applied to the input terminals of the comparator 123 together with the inverse sawtooth signal Vsw1 output from the oscillator 125. Here, when the output voltage Vm0 is higher than the inverse sawtooth signal Vsw1, then the comparator 123 will output a logic high signal and reset RS flip-flop 127. As a result, the output $\overline{Q}$ of the RS flip-flop 127 goes to a logic high causing the output of the logic gate 129 to go to a logic low, thereby turning off the N-channel FET 113.

The state wherein the output voltage Vm0 of the multiplying portion 151 is equal to the inverse sawtooth signal Vsw1 can be expressed by the following formula (4).

$$K \times (Vref2 - Vm2) \times (\underline{Vcs1} + Vref3) = Va1 \times \left(1 - \frac{tn1}{Tx1}\right) \quad (4)$$

where tn1 represents a time duration during which the N-channel FET 113 is turned on and Tx1 represents the entire duty cycle of the N-channel FET 113.

Here, it is important that the circuit of FIG. 3 operates smoothly according to formula (4) responsive to the changes in feedback voltage Vfb and the load. In other words, the feedback system must be in order so that the minimum/maximum turn-on time of the N-channel FET 113 can be controlled. First, with regard to the feedbacK system, when the feedback voltage Vfb increases, the output voltage Vm2 of the error amplifier 121 decreases, thus increasing the output voltage Vm0 of the multiplying portion 151. Thus, the output voltage Vm0 will reach the level of the inverse sawtooth signal voltage Vsw1 earlier in time causing the reset R of flip-flop 127 to be toggled earlier thereby shortening the turn-on time of the N-channel FET 113. Conversely, when the feedback voltage Vfb decreases, the output voltage Vm2 of the error amplifier 121 increases which decreases the output voltage Vm0 of the multiplying portion 151. Thus, the output voltage Vm0 will reach the level of the inverse sawtooth signal voltage Vsw1 at a later time, delaying the reset of flip-flop 127 and causing the turn-on time of the N-channel FET 113 to be extended. Thus, the feedback system of the circuit of FIG. 3 is in good order.

The point in time where the N-channel FET 113 is turned off corresponds to the point in time where tn1 of the formula (4) goes to zero. This condition can be expressed by the following formula (5).

$$Vm0 = Vsw1 (= Va1) \quad (5)$$

The conditions for satisfying the formula (5) are as follows. That is, the source voltage VcS is equal to 0 V, the output voltage Vm2 of the error amplifier 121 is at a minimum, and the output voltage (Vref2−Vm2) of the subtractor 153 is at maximum. These conditions are summarized by the following formula (6).

$$K \times (Vref2 - Vm2) \times Vref3 = Va1 \quad (6)$$

From the formula (6), it can be seen that one of the factors that determines the minimum turn-on time of the N-channel FET 113 is the third reference voltage Vref3. Thus, the third reference voltage Vref3 is defined by the following formula (7).

$$Vref3 = \frac{Va1}{K(Vref2 - Vm2)\max} \quad (7)$$

According to the formula (7), when the third reference voltage Vref3 is greater than or equal to $$\frac{Va1}{K(Vref2 - Vm2)\max},$$

then the turn-on time of the N-channel FET 113 is minimized. Also, when the output voltage (Vref2−Vm2) of the subtractor 153 is at a minimum, i.e. equal to zero, then the turn-on time of the N-channel FET 113 is maximized.

As described above, the pulse width modulation controller 111 of FIG. 3 can control the turn-on time of the N-channel FET 113, provide a stable feedback system, and operate normally in a current mode.

Figure 5:
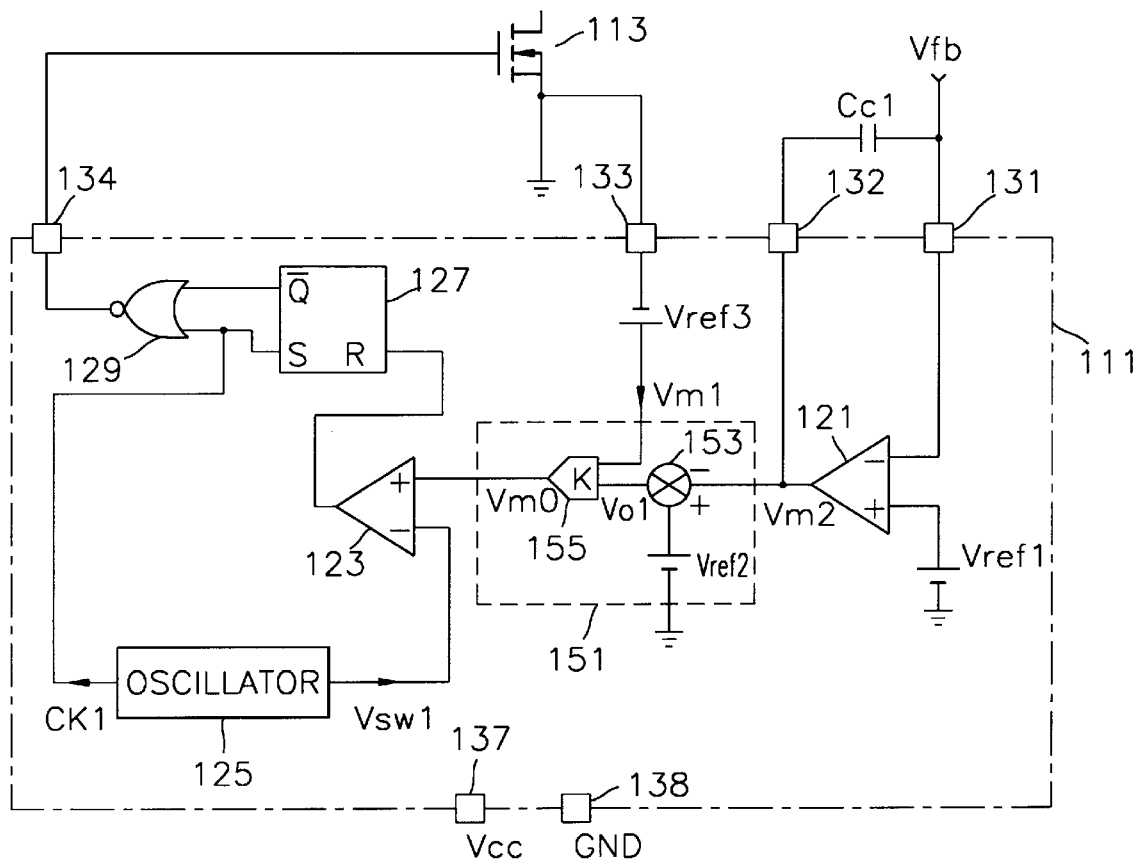
FIG. 5 is a diagram illustrating control of the FET in a voltage mode using the pulse width modulation controller according to the first embodiment of the present invention.

Referring now to FIG. 5, the structure of the pulse width modulation controller 111 according to the first embodiment of the present invention remains the same in both current mode (FIG. 3) and voltage mode (FIG. 5), except for the removal of source resistor Rs1. That is, the pulse width modulation controller according to the first embodiment of the present invention uses the source resistor Rs1 only when operated in the current mode. Thus, in the voltage mode, the source voltage Vcs1 used in the current mode is not produced. When the pulse width modulation controller 111 according to the first embodiment of the present invention operates in the voltage mode, the output voltage Vm0 of the multiplying portion 151 is expressed by the following formula (8).

$$Vm0 = K \times Vref3 \times (Vref2 - Vm2) \quad (8)$$

Figure 6:
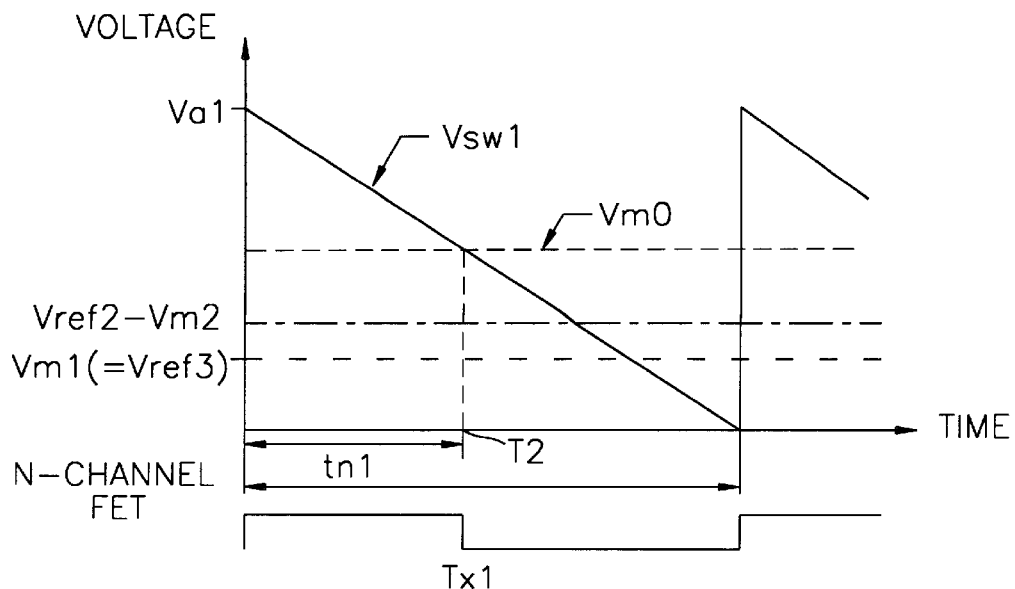
FIG. 6 is a waveform diagram of the signals shown in FIG. 5.

Referring to FIG. 6, at a point in time T2 where the inverse sawtooth signal voltage Vsw1 which has decreased from the maximum level Va1 to 0 V is equal to the output voltage Vm0 of the multiplying portion, then the N-channel FET 113, which has been actively conducting, is turned-off. The output voltage Vm0 of the multiplying portion 151, which is a constant DC voltage, is higher than the control voltage Vm1 and the voltage Vo1 of the subtractor 153. Here, the control voltage Vm1 and the voltage Vo1 of the subtractor 153 are also constant DC voltages.

When the pulse width modulation controller 111 according to the present invention operates in the voltage mode, then the turn-on time of the N-channel FET 113 is determined by the output voltage Vm0 of the multiplying portion 151 in the same manner as in the current mode. Further, the level of the output voltage Vm0 is determined by the third reference voltage Vref3 and the third reference voltage Vref3 is expressed by formula (7) above.

As described above, the operational mode of the pulse width modulation controller 111 according to the first embodiment of the present invention can be easily changed from the current mode to the voltage mode since no change is required for the controller circuit 111 to interface with the external circuitry.

Figure 7:
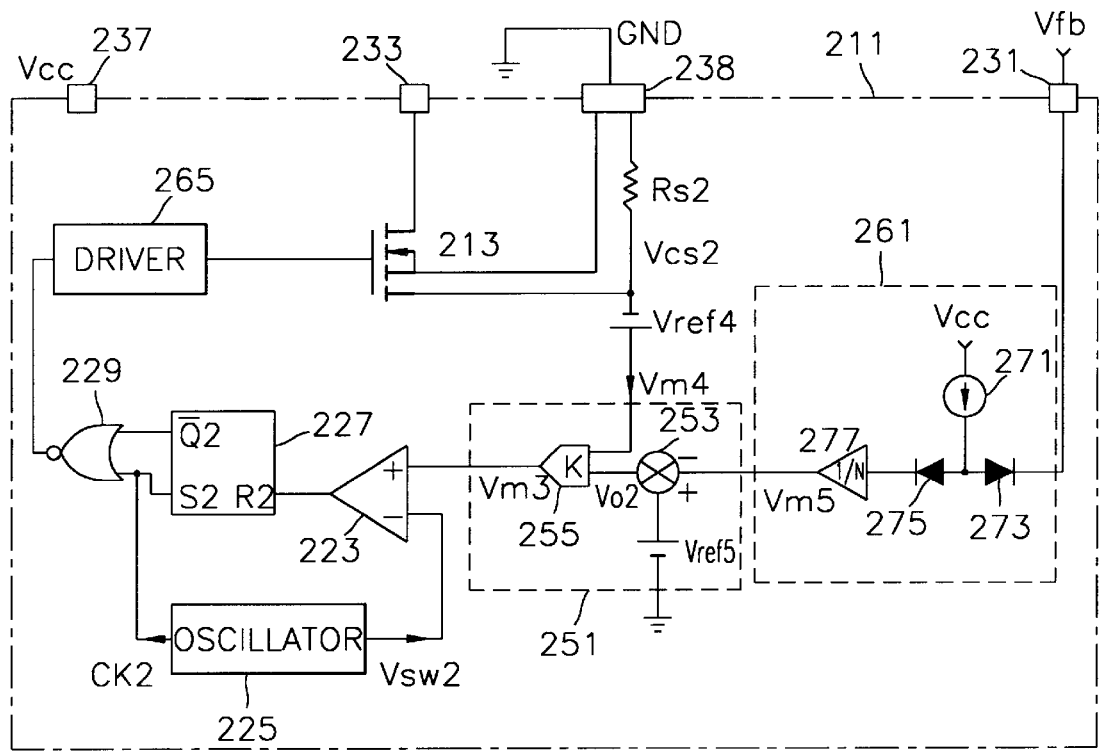
FIG. 7 is a diagram illustrating control of a power switching means in a current mode using a pulse width modulation controller according to a second embodiment of the present invention.

Referring to FIG. 7, a pulse width modulation controller 211 according to a second embodiment of the present invention includes external interface pins 231, 233, 237 and 238, power switching means 213, a source resistor Rs2, a feedback voltage divider 261, a multiplying portion 251, a comparator 223, an oscillator 225, a flip-flop 227, a logic gate 229 and a driver 265.

A feedback voltage Vfb is applied to the first pin 231, a power voltage Vcc is applied to the third pin 237, and a ground voltage is applied to the interface pin 238.

The power switching means 213, i.e. N-channel FET 213, has a drain connected to the second pin 233, a source connected to the source resistor Rs2, and a bulk which is grounded.

Also, a voltage source for generating a fourth reference voltage Vref4 is connected to the source resistor Rs2. That is, one terminal of the source resistor Rs2 is connected to the fourth pin 238 and the other terminal is connected to a negative terminal of the voltage source generating the fourth reference voltage Vref4. Source voltage Vcs2 is generated at the terminal of source resistor Rs2 connected to the voltage source.

The feedback voltage divider 261, which divides the feedback voltage Vfb applied to the first pin 231, includes a current source 271, a first diode 273, a second diode 275 and a divider 277. The current source 271 provides a constant current to the first diode 273 and the second diode 275. A cathode of the first diode 273 is connected to the first pin 231, and an anode thereof is connected to the current source 271. An anode of the second diode 275 is connected to the anode of the first diode 273, and a cathode thereof is connected to an input terminal of the divider 277. The divider 277 divides the voltage output from the second diode 275 by N and outputs an output voltage Vm5 of the feedback voltage divider 261 at its output terminal.

The multiplying portion 251 includes a subtractor 253 and a multiplier 255. One input terminal of the subtractor 253 receives the output voltage Vm5 of the feedback voltage divider 261 and the other terminal thereof receives a fifth reference voltage Vref5. Subtractor 253 subtracts the output voltage Vm5 of the feedback voltage divider 253 from the fifth reference voltage Vref5. The voltage output from the subtractor 253 is expressed by the following formula (9).

$$Vo2 = Vref5 - Vm5 \quad (9)$$

One input terminal of the multiplier 255 receives the output voltage Vo2 of the subtractor 253 and the other input terminal of multiplier 255 receives a control voltage Vm4. The control voltage Vm4 is expressed by the following formula (10).

$$Vm4 = Vcs2 + Vref4 \quad (10)$$

Thus, the output voltage Vm3 of the multiplying portion 251 is described by the following formula (11).

$$Vm3 = K \times Vm4 \times (Vref5 - Vm5) \quad (11)$$

where K is a gain of the multiplier 255.

The oscillator 225 generates a clock signal CK2 and an inverse sawtooth signal Vsw2. The clock signal CK2 is applied to one input terminal of the NOR logic gate 229 and the inverse sawtooth signal Vsw2 is applied to the inverting terminal (−) of the comparator 223.

The comparator 223 has two input terminals, the inverting terminal (−) and a non-inverting terminal (+). The non-inverting terminal (+) of the comparator 223 receives the output voltage Vm3 from the multiplying portion 251 and the inverting terminal (−) thereof receives the inverse sawtooth signal Vsw2. Comparator 223 compares the output voltage Vm3 and the inverse sawtooth signal Vsw2 and then applies the resulting signal to a reset terminal R2 of the flip-flop 227. If the output voltage Vm3 is higher than the inverse sawtooth signal Vsw2, then the output voltage of the comparator 223 goes to a positive voltage. Also, if the output voltage Vm3 is lower than the inverse sawtooth signal Vsw2, then the output voltage of the comparator 223 goes to a negative voltage.

An RS flip-flop is used as the flop-flop 227. Truth values of an RS flip-flop are shown above in Table 1.

As seen in Table 1, the logic value output from the output terminal $\overline{Q2}$ of the RS flip-flop 227 goes to a logic high when the signal applied to the reset terminal R2 of the RS flip-flop 227 is a logic high. Conversely, if the signal applied to the reset terminal R2 is a logic low, then a logic low signal is output from the output terminal $\overline{Q2}$. That is, if the output voltage of the comparator 223 is positive, then the output terminal $\overline{Q2}$ of the RS flip-flop 227 goes to a logic high. If the output voltage of the comparator 223 is negative, then the output terminal $\overline{Q2}$ of the RS flip-flop goes to a logic low if a logic high is applied to the S2 terminal of the RS flip-flop 227.

The two input terminals of the NOR logic gate 229 receive the output from the output terminal $\overline{Q2}$ of the RS flip-flop 227 and the clock signal CK2 of the oscillator 225. Thus, if either the output from the output terminal $\overline{Q2}$ of the RS flip-flop 227 or the clock signal CK2 is a logic high, then the output of the logic gate 229 goes to a logic low. If the output from the output terminal $\overline{Q2}$ of the RS flip-flop 227 and the clock signal CK2 are both low, then the output of the logic gate 229 goes to a logic high.

Figure 8:
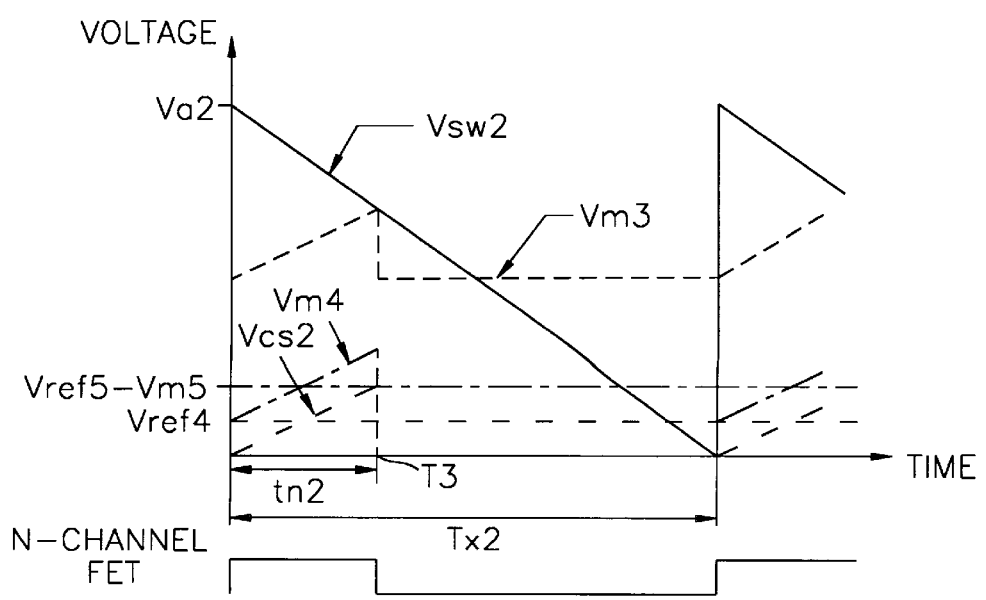
FIG. 8 is a waveform diagram of the signals shown in FIG. 7.

Referring now to FIG. 8, at time T3, when the level of the inverse sawtooth signal voltage Vsw2 has decreased from the maximum voltage Va2 to be equal to the output voltage Vm3 of the multiplying portion 251, then the N-channel FET 213, which has been in a turned-on state, is turned off. The output voltage Vm3 is higher than the control voltage Vm4 and the source voltage Vcs2 generated from the N-channel FET 213 and has a proportional relationship with those voltages. The fourth reference voltage Vref4 and the output voltage Vo2 of the subtractor 253 are constant DC voltages. However, the output voltage Vo2 of the subtractor 253 is higher than the fourth reference voltage Vref4. Also, the minimum level of the control voltage Vm4 is equal to the fourth reference voltage Vref4.

Still referring to FIG. 8, the operation of the pulse width modulation controller 211 of FIG. 7 will be described. At the point in time where the clock signal CK2 of the oscillator 225, which is initially at a logic high, is toggled to a logic low, the N-channel EFT 213 is turned on. When a feedback voltage Vfb is applied to the first pin 231 while the N-channel FET 213 is turned on, the feedback voltage Vfb is divided by N the divider 277 thereby generating the voltage Vm5. The voltage Vm5 is applied to the subtractor 253 so that the subtractor 253 outputs the voltage Vo2 expressed by the formula (9).

The voltage Vo2 is applied to the multiplier 255 together with the control voltage Vm4, thereby generating the output voltage Vm3 of the multiplying portion 251 at an output terminal of the multiplier 255. The output voltage Vm3 of the multiplying portion 251 is applied to one of the input terminals of the comparator 223 while the inverse sawtooth signal Vsw2 output from the oscillator 225 is applied to the other input terminal of comparator 223. Here, when the output voltage Vm3 of the multiplying portion 251 is equal to the inverse sawtooth signal voltage Vsw2, then the comparator 223 outputs a logic high signal. As a result, the output $\overline{Q2}$ of the RS flip-flop 227 goes to a logic high causing the output of the logic gate 229 to go to a logic low, thereby turning off the N-channel FET 213.

The state where the output voltage Vm3 of the multiplying portion 251 is equal to the inverse sawtooth signal voltage Vsw2 can be expressed by the following formula (12).

$$K \times (Vref5 - Vm5) \times (Vcs2 + Vref4) = Va2 \times \left(1 - \frac{tn2}{Tx2}\right) \quad (12)$$

where tn2 represents the time interval wherein the N-channel FET 213 is turned on and Tx2 represents the entire duty cycle of the N-channel FET 213.

Here, it is important that the circuit of FIG. 7 operates smoothly according to formula (12) responsive to the changes in the feedback voltage Vfb and load. In other words, the feedback system must be in order so that the minimum/maximum turn-on time of the N-channel FET 213 can be controlled.

First, with regard to the feedback system, when the feedback voltage Vfb increases, then the output voltage Vm5 of the feedback voltage divider 261 decreases, thus increasing the output voltage Vm3 of the multiplying portion 251. As a result, the point in time T3 at which the output voltage Vm3 equals the inverse sawtooth signal voltage Vsw2 arrives earlier and the turn-on time of the N-channel FET 213 is shortened. Conversely, when the feedback voltage Vfb 25 decreases, then the output voltage Vm5 of the feedback voltage divider 261 increases, thus decreasing the output voltage Vm3. Consequently, the point in time T3 at which the output voltage Vm3 of the multiplying portion 251 equals the inverse sawtooth signal voltage Vsw2 is delayed so that the turn-on time of the N-channel FET 213 is extended. Thus, the feedback system of the circuit of FIG. 7 is in good order.

The point in time T3 where the N-channel FET 213 is turned off corresponds to the point in time where tn2 of the formula (12) goes to zero. The condition can be expressed by the following formula (13).

$$Vm3 = Vsw2 (=Va2) \quad (13)$$

The conditions for satisfying the formula (13) are as follows. That is, the source voltage Vcs2 is equal to 0 V, the output voltage Vm5 of the feedback voltage divider 261 is at a minimum, and the output voltage (Vref5−Vm5) of the subtractor 253 is at a maximum. These are summarized by the following formula (14).

$$K \times (Vref5 - Vm5) \times Vref4 = Va2 \quad (14)$$

From the formula (14), it can be seen that one of the factors which determines the minimum turn-on time of the N-channel FET 213 is the fourth reference voltage Vref4. Thus, the fourth reference voltage Vref4 is defined by the following formula (15).

$$Vref4 = \frac{Va2}{K(Vref5 - Vm5)\text{max}} \quad (15)$$

According to the formula (15), when the forth reference voltage Vref4 is greater or equal to $$\frac{Va2}{K(Vref5 - Vm5)\text{max}},$$

then the turn-on time of the N-channel FET 213 is minimized. Also, when the output voltage (Vref5–Vm5) of the subtractor 253 is at a minimum, i.e. equal to zero, then the turn-on time of the N-channel FET 213 is maximized.

As described above, the pulse width modulation controller 211 of FIG. 7 can control the turn-on time of the N-channel FET 113 and provide a stable feedback system while operating in a current mode.

Figure 9:
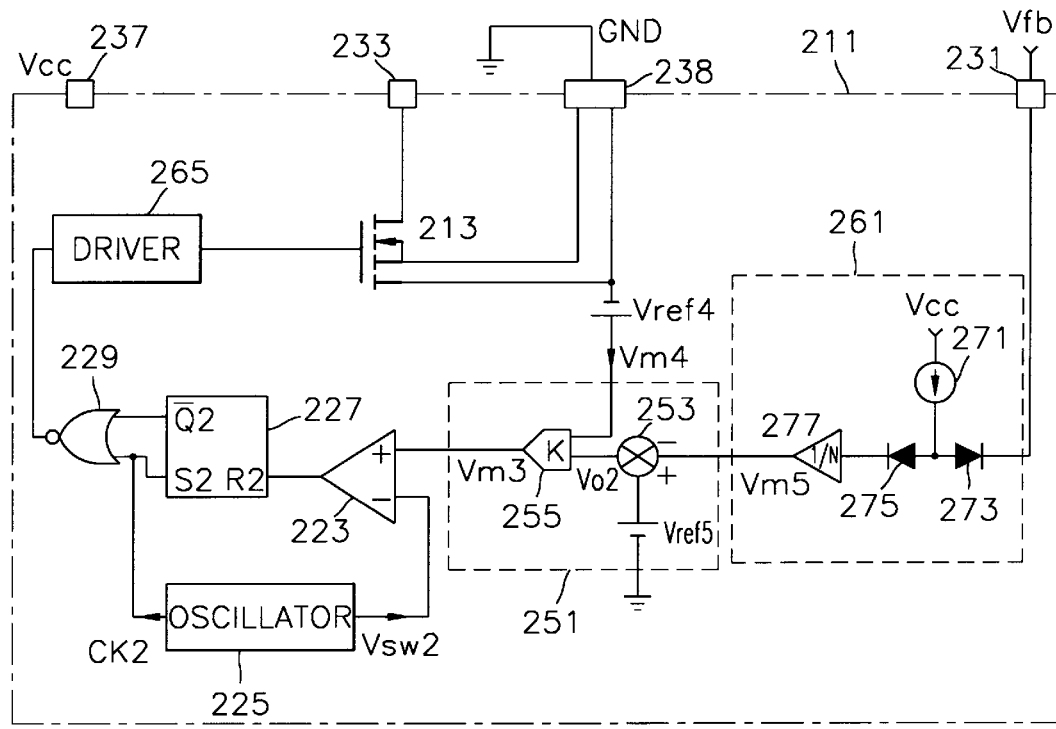
FIG. 9 is a diagram illustrating control of the power switching means in a voltage mode using the pulse width modulation controller according to the second embodiment of the present invention.

Referring to FIG. 9, the structure of the pulse width modulation controller 211 according to the second embodiment of the present invention is the same in both current mode (FIG. 7) and voltage mode (FIG. 9), except for the source resistor Rs2. That is, the pulse width modulation controller 211 according to the second embodiment of the present invention uses the source resistor Rs2 only in the current mode. Thus, in the voltage mode, the pulse width modulation controller 211 is internally wire-bonded in order to bypass resistor Rs2, and the source voltage Vcs2 used in the current mode is not produced. Thus, when the pulse width modulation controller 211 according to the second embodiment of the present invention operates in the voltage mode, then the output voltage Vm3 of the multiplying portion 251 is expressed by the following formula (16).

$$Vm3 = K \times Vref4 \times (Vref5 - Vm5) \quad (16)$$

Figure 10:
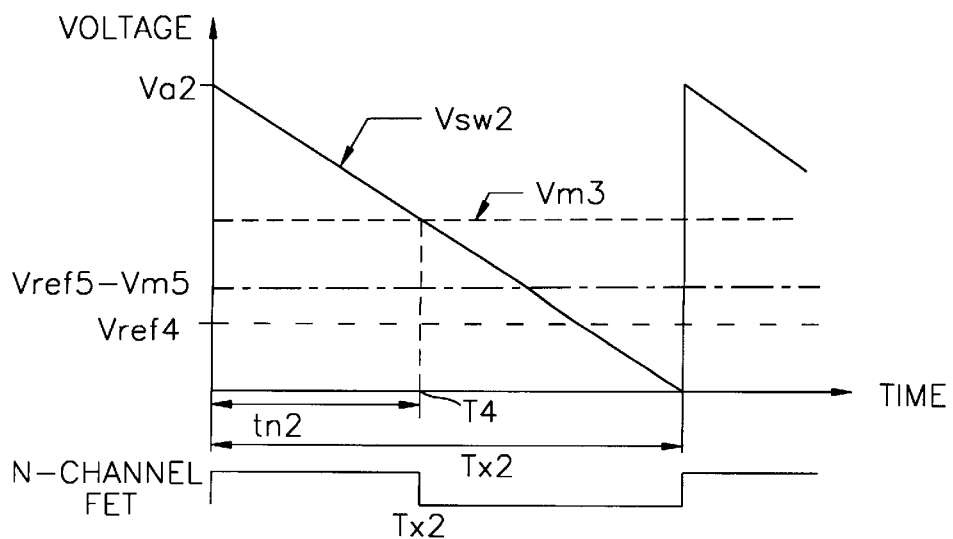
FIG. 10 is a waveform diagram of the signals shown in FIG. 9.

Referring now to FIG. 10, at point in time T4, where the inverse sawtooth signal voltage Vsw2 has ramped down from the maximum level Va2 and is equal to the output voltage Vm3 of the multiplying portion 251, the N-channel FET 213, which has been turned-on, toggles to turn-off. The output voltage Vm3 of the multiplying portion, as a constant DC voltage, is higher than the control voltage Vm4 and the voltage Vo2 of the subtractor 253. Here, the control voltage Vm4 and the voltage Vo2 of the subtractor 253 are also constant DC voltages.

When the pulse width modulation controller 211 according to the second embodiment of the present invention operates in the voltage mode, the turn-on time of the N-channel FET 213 is determined by the output voltage Vm3 of the multiplying portion 251 in the same manner as the current mode. Also, the level of the output voltage Vm3 of the multiplying portion 251 is determined by the fourth reference voltage Vref4. The fourth reference voltage Vref4 is expressed by the above formula (15).

As described above, the operation mode of the pulse width modulation controller 211 according to the second embodiment of the present invention can be easily converted from the current mode to the voltage mode since no extra external component or the modification in connection with an external circuit is necessary. Also, the N-channel FET 213 is integrated into the pulse width modulation controller 211, so that only four pins 231, 233, 237 and 238 are necessary.

As described above, in the pulse width modulation controller according to the present invention, mode conversion from current mode to voltage mode can be easily achieved.

Also, the number of pins is reduced to four by integrating the N-channel FET 213 into the pulse width modulation controller circuit.

While the present invention has been illustrated and described with reference to specific embodiments, further modifications and alterations will occur to those skilled in the art within the spirit and scope of this invention.

What is claimed is:

1. A pulse width modulation controller for controlling a power switch, controller comprising:

an error amplifier for receiving an feedback voltage and a first reference voltage in order to generate an error voltage;

a multiplying portion for receiving an externally applied voltage and the error voltage and outputting a first control voltage, where the externally applied voltage is a voltage generated by the power switch when the controller is configured to operate in a current mode, such that the first control voltage is proportional to the multiplication product of the voltage generated from the power switch times a second reference voltage less the error voltage, and where the externally applied voltage is a ground voltage when the controller is configured to operate in a voltage mode, such that the first control voltage is proportional to the multiplication product of the ground voltage and the second reference voltage less the error voltage;

an oscillator for generating a clock signal and an inverse sawtooth signal;

a first comparator for comparing the inverse sawtooth signal with the first control voltage in order to generate a second control voltage;

a flip-flop having set, reset and inverting output terminals, the set terminal being configured to receive the clock signal, the reset terminal being configured to receive the second control voltage; and a logic gate having first and second input terminals and an output terminal, the first input terminal being configured to receive the clock signal, the second terminal being coupled to the inverting output terminal of the flip-flop, and the output terminal being coupled to the power switch such that the output terminal of the logic gate controls the power switch.

2. The pulse width modulation controller of claim 1, wherein the multiplying portion comprises:

a subtractor for subtracting the error voltage output from a third reference voltage to produce a third control voltage; and a multiplier for multiplying the third control voltage with the sum of the externally applied voltage and the second reference voltage.

3. The pulse width modulation controller of claim 1, wherein the flip-flop is an RS flip-flop.

4. The pulse width modulation controller of claim 1, wherein the logic gate is a NOR gate.

5. The pulse width modulation controller of claim 1, further including a capacitor connected between an output of the error amplifier and an inverting input of the error amplifier, wherein the feedback voltage is applied to the inverting input of the error amplifier and the first reference voltage is applied to a non-inverting input of the error amplifier.

6. The pulse width modulation controller of claim 1, wherein the power switch is an N-channel field effect transistor (FET).

7. A pulse width modulation controller comprising:

at least first, second, and fourth interface pins;

a voltage divider having input and output terminals, where the voltage divider is configured to divide a voltage received at the input terminal and output a divided voltage at the output terminal, and where the input terminal of the divider is coupled to the first interface pin;

a power switch having gate, source and drain terminals, the drain terminal being coupled to the second pin and the source terminal being coupled to the fourth pin;

a resistor coupled between the source terminal of the power switch and the fourth interface pin;

a multiplying portion having first and second input terminals and an output terminal, the first input terminal of the multiplying portion being coupled to the output terminal of the voltage divider, where the multiplying portion is configured to multiply a voltage received at the second input terminal by a difference voltage between the first reference voltage and the divided voltage received at the first input terminal;

a voltage reference coupled between the source of the power switch and the second input terminal of the multiplying portion;

an oscillator configured to generate a clock signal at a first output terminal of the oscillator and an inverse sawtooth signal at a second output terminal of the oscillator;

a first comparator having inverting and non-inverting input terminals and an output terminal, the non-inverting input terminal of the first comparator being coupled to the output terminal of the multiplying portion and the inverting terminal of the first comparator being coupled to the second output terminal of the oscillator;

a flip-flop having set and reset terminals and an inverting output terminal, the set terminal being coupled to the first output terminal of the oscillator and the reset terminal being coupled to the output terminal of the first comparator; and a logic gate having first and second input terminals and an output terminal, the first input terminal of the logic gate being coupled to the inverting output terminal of the flip-flop, the second input terminal of the logic gate being coupled to the first output terminal of the oscillator, and the output terminal of the logic gate being coupled to the gate of the power switch.

8. The pulse width modulation controller of claim 7, wherein the multiplying portion further comprises:

a subtractor having first and second input terminals and an output terminal, the first input terminal of the subtracter being coupled to the input terminal of the multiplying portion, the second input terminal of the subtractor being configured to receive the first reference voltage, where the subtracter is configured to subtract the voltage received at the first input terminal of the subtractor from the reference voltage received at the second input terminal of the subtractor in order to generate a difference voltage at the output terminal of the subtractor; and a multiplier having first and second input terminals and an output terminal, the first input terminal of the multiplier being coupled to the second input terminal of the multiplier portion and the second input terminal of the multiplier being coupled to the output terminal of the subtractor, and the output terminal of the multiplier being coupled to the output terminal of the multiplying portion.

9. The pulse width modulation controller of claim 7, wherein the flip-flop is an RS flip-flop.

10. The pulse width modulation controller of claim 7, wherein the logic gate is a NOR gate.

11. The pulse width modulation controller of claim 7, wherein the voltage divider comprises:

a current source;

a first diode having an anode connected to the current source and a cathode connected to the first interface pin;

a second diode having an anode connected to the anode of the first diode; and a divider having an input terminal connected to a cathode of the second diode and an output terminal coupled to the input terminal of the multiplying portion.

12. The pulse width modulation controller of claim 7, wherein the fourth pin is coupled to the ground voltage such that the controller operates in a current mode.

13. The pulse width modulation controller of claim 7, wherein the fourth interface pin is coupled to the ground voltage such that the controller operates in a voltage mode.

14. The pulse width modulation controller of claim 7, wherein the power switching means is an N-channel field effect transistor (FET).

15. The pulse width modulation controller of claim 13, wherein the fourth interface pin is coupled with the source terminal of the power switch.

* * * * *